US006555832B1

United States Patent
Ryding et al.

(10) Patent No.: US 6,555,832 B1
(45) Date of Patent: Apr. 29, 2003

(54) DETERMINING BEAM ALIGNMENT IN ION IMPLANTATION USING RUTHERFORD BACK SCATTERING

(75) Inventors: Geoffrey Ryding, Manchester, MA (US); Theodore H. Smick, Essex, MA (US); John Ruffell, Sunnyvale, CA (US); Marvin Farley, Ipswich, MA (US); Peter Rose, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 199 days.

(21) Appl. No.: 09/686,092

(22) Filed: Oct. 12, 2000

Related U.S. Application Data

(60) Provisional application No. 60/159,116, filed on Oct. 13, 1999, and provisional application No. 60/203,579, filed on May 11, 2000.

(51) Int. Cl.[7] .......................... H01J 37/317; H01J 37/00
(52) U.S. Cl. .................. 250/492.21; 250/397; 250/398; 250/252.1; 250/442.11
(58) Field of Search ............................ 250/492.21, 397, 250/398, 442.11, 252.1

(56) References Cited

U.S. PATENT DOCUMENTS

| | | | |
|---|---|---|---|
| 6,207,959 B1 * | 3/2001 | Satoh et al. | 250/442.11 |
| 6,255,662 B1 * | 7/2001 | Rubin et al. | 250/492.21 |
| 6,437,351 B1 * | 8/2002 | Smick et al. | 250/492.21 |

FOREIGN PATENT DOCUMENTS

| | | |
|---|---|---|
| EP | 0 398 335 | 11/1990 |
| JP | 60124343 | 12/1993 |
| JP | 11120954 | 4/1999 |
| WO | WO9913488 | 9/1998 |

OTHER PUBLICATIONS

"In–situ Rutherford Backscattering Design for Early SIMOX–SOI Metallic Screening", L.P. Allen, et al., Nuclear Instruments & Methods in Physics Research, Section—B: Beam Interactions With Materials and Atoms, NL, North–Holland Publishing Company, Amsterdam, vol. 118, No. 1, Sep. 1, 1996, pp. 782–786.

* cited by examiner

*Primary Examiner*—Bruce Anderson
*Assistant Examiner*—Nikita Wells
(74) *Attorney, Agent, or Firm*—Boult Wade Tennant

(57) ABSTRACT

A back scattered ion receiver is mounted on the process chamber of an ion implanter to receive beam ions back scattered from a wafer mounted on the wafer holder in the chamber. Minima in the intensity of back scattered ions as the wafer on the holder is moved relative to the beam direction, can be used to obtain an accurate calibration of the true beam direction. Beam direction error can then be compensated for when operating holder tilt and twist mechanisms so as to bring a process wafer accurately into the required orientation relative to the true beam. If the crystallographic alignment and orientation of process wafers has been precharacterised, this data can be used to control the wafer holder to align process wafers crystallographically to the process beam.

19 Claims, 2 Drawing Sheets

DETERMINING BEAM ALIGNMENT IN ION IMPLANTATION USING RUTHERFORD BACK SCATTERING

This application claims priority on provisional Application No. 60/159,116 and 60/203,579 filed on Oct. 13, 1999 and May 11, 2000, the entire contents of which are hereby incorporated by reference.

FIELD OF THE INVENTION

The invention relates to ion implantation and particularly to methods and applications for determining the alignment of the ion beam in the process chamber of an ion implanter.

BACKGROUND OF THE INVENTION

Techniques of ion implantation are well known, particularly when used for implanting impurities etc. in semiconductor wafers, e.g. for obtaining a desired dopant concentration in regions of the wafer.

There is an increasing requirement for extreme accuracy between the direction of the beam of ions to be implanted in the wafer and the plane of the wafer itself, and more particularly the principle axis of the crystalline structure within the silicon wafer which is nominally normal to the wafer surface. An accurate knowledge and control of the angle of the ion beam to the surface of the wafer is necessary for obtaining precise implant angles relative to the wafer surface. This is important for so called shadow implants, that is implants into deep trenches on the wafer surface, and also for very shallow implants through narrow openings in a photo resist mask on the surface of the wafer. To achieve very high accuracy, it is necessary to have knowledge of the angle between the wafer and the ion beam to within fractions of a degree. Whilst mechanical calibration of the wafer holder of the ion implanter can permit control of the holder relative to the implantation process chamber to high accuracy, the direction of the ion beam within the process chamber may not be predictable to the same accuracy and may indeed be different for different process beams.

Rutherford Back Scattering is a well known technique for studying the surface composition and depth profiles of crystalline solids. The technique has also been considered for the measurement of dose accumulation in a semiconductor substrate during an implant. Prior art includes the book "Back Scattering Spectrometry" by Chu et al, published by Academic Press 1978. Reference may also be made to published Japanese Patent Specification 60-124343, published 3rd July 1985 (Hitachi).

A technique for checking the alignment of a principle axis in a crystal to an incident ion beam using Rutherford Back Scattering (RBS) is described in the above book by Chu et al, Chapter 8.2 Crystal Alignment Procedures, from page 225 to page 229. In this technique, the crystal is mounted on a goniometer when exposed to the ion beam. The goniometer allows the crystal to be rotated about an axis, which axis can itself be tilted, to a desired tilt angle relative to the incident beam direction, about a tilt axis which is made perpendicular to the beam direction. Back scattered ions are detected at a detector located in the plane common to the beam direction and the tilt axis.

The chapter describes how plots can be made on a polar diagram of minima in the back scattered intensity at a selected energy, as the crystal is rotated about the rotation axis when aligned at various tilt angles relative to the incident beam. Essentially, if a principle crystal axis of the crystal on the goniometer is accurately aligned to the axis of rotation of the goniometer, then minima in the back scattered intensity for a particular tilt angle, are symmetrically distributed about the polar plot at angles corresponding to the orientation in the crystal of crystal planes parallel to the principle crystal axis. Any deviation of the principle crystal axis from the axis of rotation of the goniometer, causes the minima to plot around the polar diagram in such a way that the offset in polar co-ordinates of the crystal axis relative to the axis of rotation can easily be measured.

In ion implanters it is known for the wafer holder to be mounted for rotation about an axis (twist axis) which is nominally perpendicular to the surface of a silicon wafer mounted on a holder. The wafer holder is also commonly adjustable in tilt, to change the angle that the wafer presents to the ion beam, about a tilt axis perpendicular to the nominal beam direction and to the twist axis. An example of a wafer holder of this kind is described in WO 99/13488 (Orion Equipment Inc.).

Examples of the invention provide a solution to the problem of accurately measuring, confirming or correcting the alignment of the process beam in the process chamber of an ion implantation system.

SUMMARY OF THE INVENTION

In its broadest aspect, the invention provides for the use of Rutherford Back Scattering (RBS) techniques for measuring, confirming or correcting the alignment of the process beam in the process chamber of an ion implantation system. The direction of an ion beam relative to a wafer holder in an implant chamber of an ion implanter can be calibrated by a) mounting on the holder a crystalline material so that the crystal lattice of the crystalline material has a known nominal orientation relative to the holder, b) directing the ion beam at the crystalline material on the holder, c) effecting relative movement between the direction of the ion beam and the orientation of the holder, d) monitoring the intensity of beam ions back scattered from the crystalline material during said relative movement to identify, from a corresponding minimum in said monitored intensity, at least one selected orientation of the crystal lattice of the crystalline material relative to the ion beam, and e) using the relative orientation of the ion beam and the holder when said selected crystal lattice orientation is identified and the known nominal orientation of the crystal lattice to the holder to provide a calibration point for the direction of the ion beam relative to the wafer holder.

This technique uses the phenomenon mentioned in Chu et al whereby the intensity of back scattered beam ions falls away when the beam becomes aligned with a channelling plane or axis of the crystal. This is because beams tend to travel more deeply into the crystal and thus back scattered ions tend to be absorbed when passing through a greater thickness of crystal material in returning to the surface for detection.

Because the nominal orientation of the crystalline material relative to the holder is known the actual orientation between the ion beam and the holder at a minimum of the back scattered intensity corresponding to a selected channelling plane or axis of the crystal can be used as a calibration point to calibrate the direction of the ion beam relative to the wafer holder.

For a single measurement, the accuracy of the calibration point can correspond to the accuracy with which the orientation of the crystalline material relative to the holder is known. To compensate for uncertainty in the precise orientation of the crystalline material relative to the holder, the measurement can be repeated after reversing the orientation of the crystalline material on the holder by 180° and then taking an average of the two measured calibration points.

Where the ion beam has a nominal direction and the wafer holder can tilt the wafer about a tilt axis perpendicular to the nominal beam direction and can rotate the wafer about a twist axis nominally perpendicular to said tilt axis, the component of the direction of the ion beam relative to the wafer holder in the plane perpendicular to the tilt axis can be calibrated by identifying a minimum in the monitored back scattered ion intensity when changing the tilt of the holder. In cases where the wafer holder cannot be tilted about an axis orthogonal to said tilt axis (and still perpendicular to the nominal beam direction), then it is necessary for the ion beam direction to be adjustable in a plane parallel to the tilt axis, so that the component of the direction of the ion beam relative to the wafer holder in said parallel plane can be calibrated by identifying a minimum in the monitored back scattered ion intensity when adjusting the beam direction in said plane.

In another arrangement, the alignment of the ion beam in the plane of the tilt axis can be checked using a crystalline material on the holder with a known crystal direction aligned with said twist axis, by tilting the holder to bring said crystal direction parallel to the plane of the beam parallel to the tilt axis and monitoring the back scattered ion intensity while rotating the holder about the twist axis. If the ion beam is misaligned in the plane of the tilt axis so as not to be parallel to the twist axis (and the known crystal direction) the back scattered ion intensity will be higher in the absence of perfect channelling of beam ions down the known crystal direction, and will vary as the holder is rotated as successive channelling planes become parallel to the beam alignment.

The invention also provides alignment measuring apparatus for fitting to an ion implanter of the kind having a process chamber having a chamber wall, an ion beam generator to produce the beam of ions for implantation, said beam having a nominal beam direction in said chamber, a wafer holder in said chamber to carry for ion implantation therein a planar crystalline wafer having a crystal axis nominally normal to the plane of the wafer, said wafer holder having a normal direction which is nominally normal to the plane of a wafer on said holder, a tilt mechanism for adjusting the tilt angle of said normal direction of the holder relative to said nominal beam direction about an axis perpendicular to said normal direction and to said nominal beam direction, and a twist mechanism for rotating the holder and any wafer thereon to selected rotational positions about an axis parallel to said normal direction, the alignment measuring apparatus comprising a scattered ion receiver adapted to be mounted on said chamber wall to receive beam ions back scattered from a wafer on the holder and a scattered ion current detector for determining the current of said back scattered beam ions received by said receiver.

The back scattered ion receiver and current detector can, when mounted on an ion implanter as described, be used for performing the calibration methods described above.

Preferably, the scattered ion receiver includes a filter to reject low energy secondary ions from the wafer and pass substantially only back scattered beam ions to said current detector. The scattered ion current detector may comprise an ion counter providing a value of said current corresponding to the count after a predetermined counting period.

The invention also contemplates more generally, other apparatus for performing the described methods.

Examples of the invention will now be described with reference to the drawings:

DETAILED DESCRIPTION OF THE PREFERRED EMBODIMENTS

Figure 1:
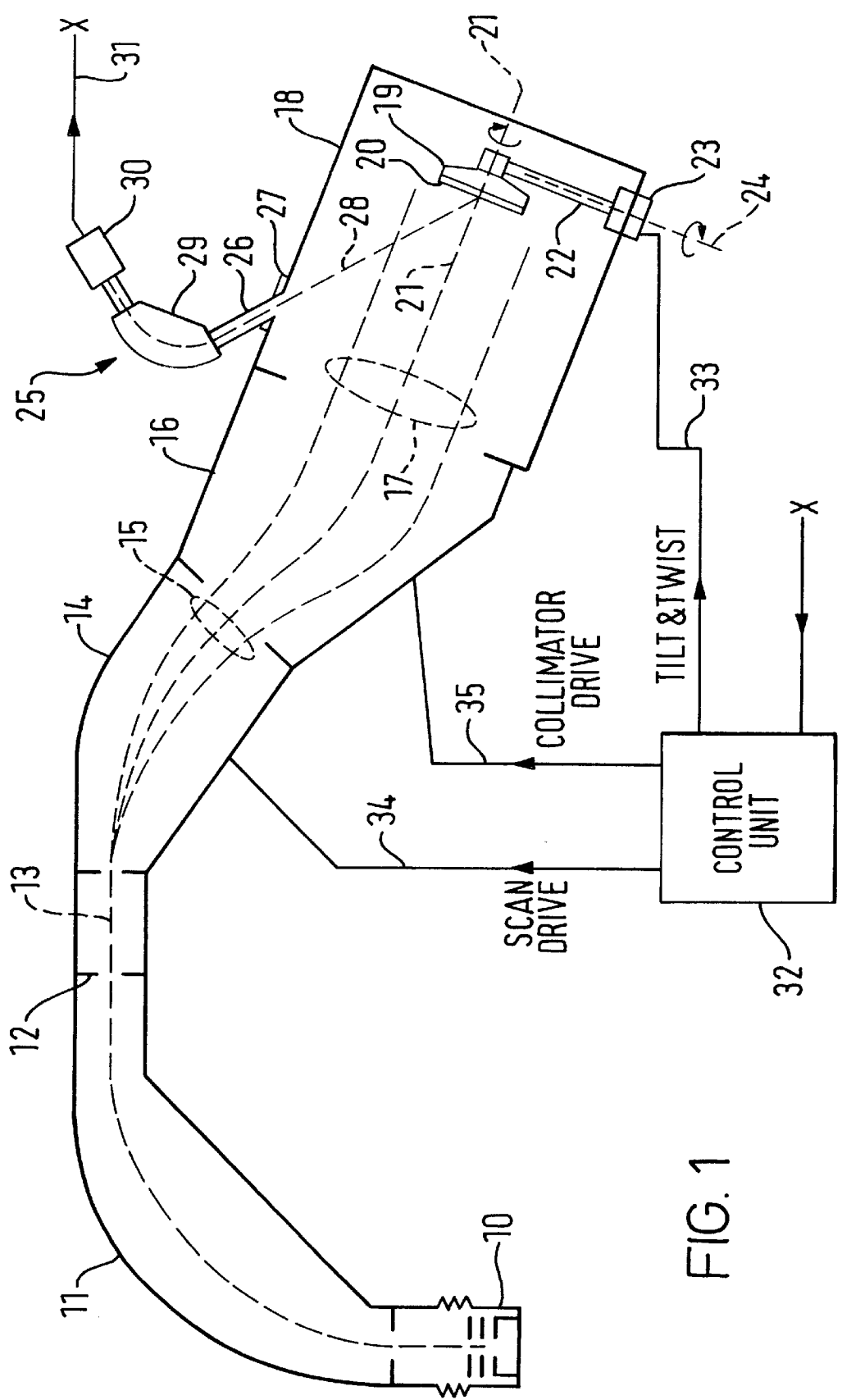
FIG. 1 is a schematic diagram in plan view of an ion implanter incorporating back scattered ion detection equipment for use in examples of the present invention.

Referring to FIG. 1, the ion implanter has an ion source 10 delivering a beam of ions to a mass analyser 11. Ions of selected mass in the beam pass through a mass selection slit 12, optionally through an additional beam accelerator 13 and into a beam scanning unit 14. The beam scanning unit 14 contains a varying scanning field, which may be an electric field but is preferably a varying magnetic field, to produce an angular scan of the beam direction to and fro as illustrated in the diagram at 15. The angularly scanned beam then enters a collimator 16 to bring the angularly scanned beam 15 back to a parallel scanned beam as illustrated at 17. The parallel scanned beam 17 enters a process chamber 18 containing a wafer holder 19 carrying a wafer 20. The wafer holder 19 is mounted for rotation about a twist axis 21 which is nominally normal to the plane of the wafer 20 through the centre of the wafer. The holder 19 is mounted by a scanning arm 22 from a linear scanning mechanism 23 on the wall of the process chamber 18. The linear scanning mechanism 23 enables the wafer holder 19 to be scanned transversely to the plane of the scanned beam 17, thereby providing a complete hybrid scanning system for implanting the wafer.

The linear scanning mechanism 23 also permits, rotation of the scanning arm 22 about a tilt axis 24 so that the angle presented to the beam by a wafer 20 on the wafer holder 19 can be adjusted. Generally, the tilt axis 24 lies in or close to the surface plane of the wafer 20, but this is not shown in the drawings. Rotation of the wafer holder 19 about twist axis 21 can alter the orientation of the wafer to the beam.

In the illustrated example, a scattered beam ion receiver, indicated generally at 25 is mounted on a wall of the process chamber 18 so as to provide a line of sight to a spot on a wafer 20 on the holder 19 which can be illuminated by the scanned beam 27. The back scattered beam ion receiver 25 comprises a beam tube 26 mounted by a flange 27 to the wall of the process chamber in communication with the interior of the chamber. The tube 26 is aligned so that back scattered ions from the wafer 20 can travel along a path 28 to enter the tube 26. Back scattered ions pass along the tube 26 to an energy analyser 29 which is typically formed as a magnetic sector analyser. The analyser 29 is intended to remove from the ions entering the receiver along the path 28 secondary ions emitted from the surface of the wafer 20, which generally have a lower energy compared to back scattered beam ions. As a result, only back scattered beam ions are passed from the energy analyser 29 to an ion current detector 30.

The ion current detector 30 is typically an ion counter arranged to accumulate a count of received ions for a predetermined counting period, so that the resulting count at the end of the period represents the rate of receipt by the counter of back scattered ions, and hence the current of back scattered ions.

A signal representing the received ion count is delivered along a line 31 to a control unit 32. The control unit can control the tilting and twisting of the ion holder 19, by control signals along a combined line 33. The tilt control is effective to control the rotation of the ion holder around the tilt axis 24, and the twist control is effected to control the rotation of the ion holder around the twist axis 21.

In addition, the control unit 32 provides drive signals on the lines 34 and 35 respectively to provide the required drives to the beam scanner 14 and the collimator 16. For example, the scan drive on line 34 to the scanner 14 may comprise an energising current to magnet windings providing the required scanning magnetic field in the scanner 14. Similarly, the collimator drive on line 35 may comprise the required drive current to the magnetic windings providing the required collimating magnetic field in the collimator 16.

Figure 2:
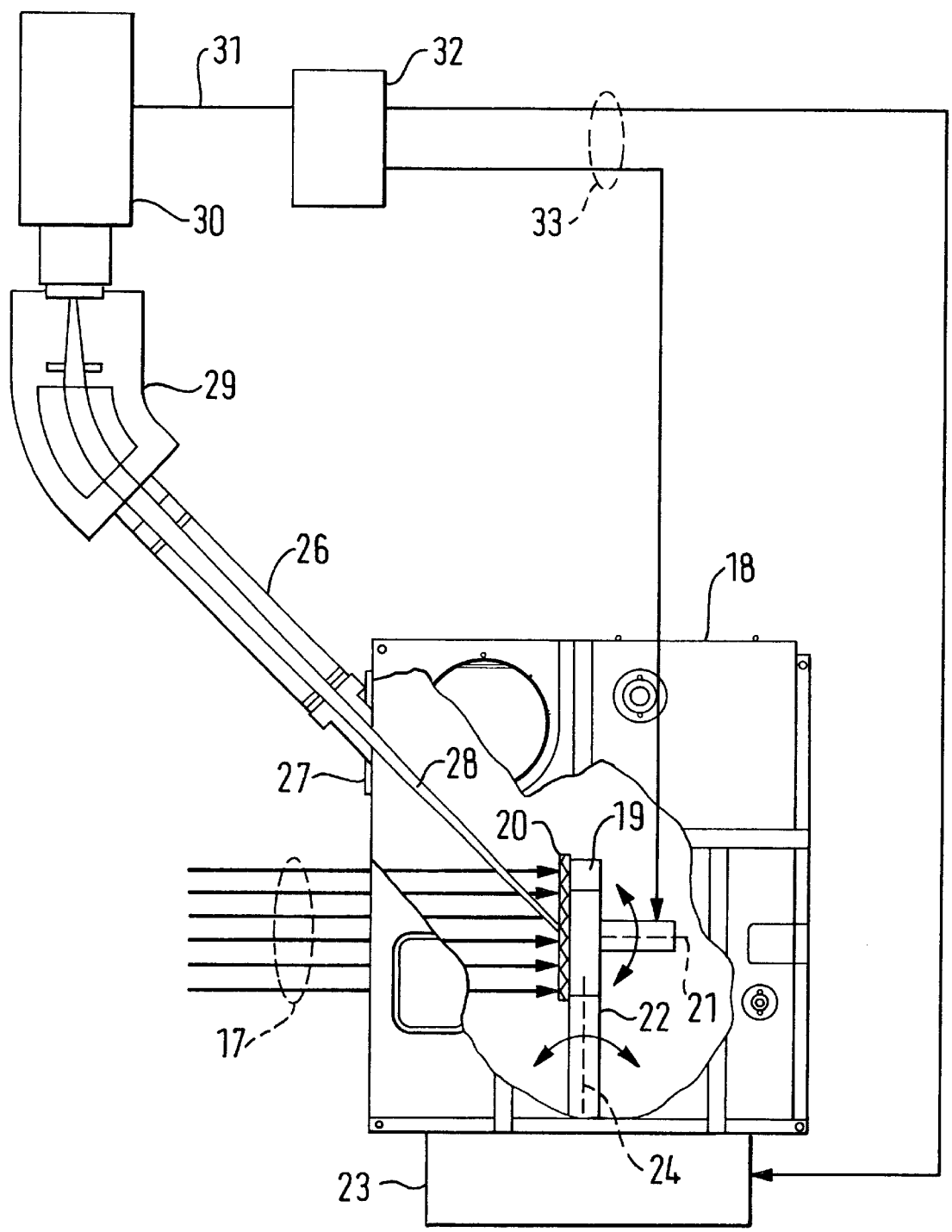
FIG. 2 is a schematic diagram in plan view of the process chamber of an ion implanter and illustrating the back scattered ion detection equipment in greater detail.

Referring to FIG. 2, the elements illustrated in the Figure which are common to those of FIG. 1 are given the same reference numerals. Accordingly, back scattered ions from the wafer 20 follow along a path 28 through the guide tube 26 to the energy analyser 29. The guide tube 26 can be effective to confine the back scattered ions reaching the energy analyser 29 to those from a relatively small region of the surface of the wafer 20. However, for the applications which will be described in more detail herein, it may not be necessary to localise the origin of the measured back scattered ions to great accuracy.

The energy analyser 29, as mentioned above, need be sufficient only to remove from ions along path 28 low energy ions corresponding to secondary ions emitted from the surface of the wafer 20. Accordingly the analyser 29 should allow back scattered ions of a wide range of energies, greater than the energies of secondary ions, to reach the sensitive element of the ion counter 30. The ion counter 30 may be a Channeltron detector from Amptek. The energy resolution of the analyser 29 need not be greater than about 10%.

As has been mentioned previously, the provision of the receiver for measuring the current of Rutherford Back Scattered ions in the process chamber of an ion implanter can be used for accurately calibrating, correcting or checking the alignment of the process ion beam relative to the wafer holder.

Generally, the ion implanter is constructed and designed so that the ion beam 17 is accurately parallel to a datum or nominal ion beam direction within the process chamber 18. This nominal beam direction is intended to be precisely perpendicular to the tilt axis 24 of the wafer holder, which is in turn designed so that a normal to the plane of the wafer 20 on the holder is also accurately perpendicular to this tilt axis. Furthermore, the twist axis 21 of the wafer holder 19 should be accurately parallel to the normal direction of the wafer holder 19. If all is accurate and correct, the wafer holder can then be twisted and tilted so as to present the wafer 20 to the ion beam 17 at precisely a desired angle relative to the plane of the wafer. Also, the wafer can be oriented, by rotation about the twist axis 21, relative to the beam also as required.

However, in practice there is usually some uncertainty as to the precise alignment of the beam 17 relative to the wafer holder 19 and a wafer 20 carried by the holder. The alignment of the beam 17 can thus be calibrated or checked and if necessary corrected by the following procedure.

Firstly, the crystallographic orientation and alignment of a test wafer of crystalline material, typically silicon, is carefully analysed using for example x-ray diffraction techniques. Stock silicon wafers have a nominal alignment and orientation so that the <001> is nominally normal to the plane of the wafer and the <110> direction is defined by a flat or notch at a position around the periphery of the wafer. However, stock wafers typically differ from the nominal in both <001> alignment and <110> orientation by large fractions of a degree or more. Accordingly, the first step is to accurately characterise the aforementioned errors in the crystal alignment and orientation of the test wafer to be used. This may be done by x-ray diffraction which will be well know to the skilled person.

The test wafer is then mounted on the wafer holder 20 in the process chamber 18 and a beam of the ions required for the following implantation process, e.g. boron ions, is directed at the wafer. The beam used at this time may be a scanned beam as would be used for ion implantation, or the scanner 14 may be set to produce an unscanned beam directed substantially at the centre line of the wafer 20 on the holder 19.

The twist and tilt angles of the wafer holder are then adjusted to present a selected crystal axis or plane to the nominal beam direction, so that if the actual beam direction is precisely accurate, beam ions should channel down the selected axis or plane. In adjusting the twist and tilt to present the required axis or plane, a correction can be built in corresponding to the measured error of the crystal alignment and orientation of the wafer 20 being used for the test.

The tilt of the wafer is then rocked to and fro on either side of the predetermined tilt and the intensity of back scattered ion current from the counter 30 is recorded in the control unit 32 against the tilt angle. The precise tilt angle at the minimum of the recorded ion beam current is then calculated, typically using a known curve fitting algorithm. This tilt angle may differ from the nominal tilt angle which should have directed the channelling axis or plane in alignment with the nominal beam direction. Any such difference represents a misalignment of the beam 17 relative to nominal in a plane perpendicular to the tilt axis 24.

This experiment can be performed using any one of a large number of possible axes or planes in the wafer. If the beam 17 has no alignment error in a plane parallel to the tilt axis, then the procedure can be conducted using a channelling axis to detect the required tilt angle minimum. However, where a misalignment can also be expected in the plane of the tilt axis 24, this misalignment may reduce the depth of the back scattered ion intensity minimum corresponding to a channelling axis, and it may be preferred to employ instead a channelling plane to detect the tilt angle minimum, arranging for the channelling plane to be accurately parallel to the tilt axis 24 during the procedure.

Following measurement of the tilt angle corresponding to the required intensity minimum, the wafer holder 19 can be twisted through 180°, and the procedure repeated. Any difference between the measured tilt angles corresponding to the required intensity minima would then represent a misalignment between the true normal of the wafer 20 on the holder 19 and the twist axis 21. By taking the average of the two values, a corrected value for the misalignment of the beam in a plane perpendicular to the twist axis 24 is obtained.

For practical purposes, the ion implanter described above has no means of correcting any such misalignment perpendicular to the twist axis 24. Accordingly, the value of misalignment in this plane is used as a correction when the required tilt of a wafer to be implanted is being set by the tilt drive 23 under control of the control unit 32.

In order to check for any misalignment of the beam direction in the plane parallel to the tilt axis 24, the wafer holder is first oriented by adjusting the tilt and twist drives to bring a channelling axis or plane of the wafer 20 into accurate alignment with the nominal beam direction in the plane parallel to the tilt axis 24. The direction of the beam is then itself varied by an appropriate adjustment of the drive to the scanner or collimator 14, 16. Generally, a variation in beam direction of about plus or minus one or two degrees can be obtained in the plane of the tilt axis 24 by suitable adjustment of the scan and collimator drives. During the beam direction adjustment, the intensity of the back scattered ion current is monitored by the control unit 32 to identify the beam direction setting at which the intensity is at a minimum. This should then correspond to the beam direction being precisely aligned with the selected channelling axis or plane of the wafer.

In order to bring the beam direction accurately into alignment with the nominal beam direction in this way, it is of course necessary to ensure that the water 20 can present a channelling axis or plane which is accurately aligned to the nominal beam direction. For this purpose, it may be necessary to use for the test wafer 20 one which has been measured to have a very small error in the crystal alignment relative to the plane of the wafer and the orientation indicating notch or flat.

Alternatively, if the alignment error of the wafer is known, the beam could still be set up to align with the selected channelling axis or plane of the wafer, there would then be a misalignment of the beam in the plane of the tilt axis 24, but this misalignment would be precisely known, corresponding to the crystal alignment error of the test wafer that was used. Generally, however, it will be preferable to ensure that the misalignment error of the beam in the plane of the tilt axis 24 is minimised.

Having calibrated the beam alignment by the above process, correcting any misalignment in the plane of the tilt axis 24, and measuring any misalignment in the plane perpendicular to the tilt axis, it is now possible to proceed with implanting process wafers and controlling the wafer holder 19 so as to present the wafer very precisely to the beam orientation.

If it is required to align the crystal structure of a process wafer accurately to the process beam, then the crystal alignment and orientation of the process wafers must be pre-measured, e.g. using known x-ray diffraction techniques. With the crystal alignment error data for each process wafer, and knowing precisely any beam alignment error of the ion implanter, the crystal alignment of the process wafer can then be accurately aligned as necessary to the process beam.

In another application, the back scattered ion intensity measurements can be used to identify and correct for any misalignment between the twist axis 21 of the wafer holder 19 and the true normal direction, being the true normal of a wafer 20 on the holder 19. For this procedure, it is necessary to have accurately corrected and measured the alignment of the beam so that this is precisely known. It is also important that the beam direction is accurately aligned such that the twist axis 21 can be brought into alignment with the beam direction at an appropriate tilt angle of the wafer holder 19.

Then, a test wafer is mounted in the wafer holder 19 and the wafer holder tilted to a predetermined tilt angle, say 20°, relative to the tilt position nominally aligning the wafer normal to the beam direction. The intensity minima of the back scattered ions can then be plotted against the rotational position as the wafer holder 19 is twisted. This mimics the technique described in the above Chu book for aligning a crystal axis to the beam. If there is any misalignment between the main crystal axis <001> and the twist axis 21, the minima will plot to slightly different angular twist positions which can be used, as described by Chu, to identify the tilt and twist angle which would be needed to bring the crystal axis back into precise alignment with the ion beam. In the above described procedure, any error that is measured by the procedure can have two different sources. On the one hand the error may be an error in the crystal alignment of the test wafer 20 relative to the normal to the wafer, and on the other hand it may be due to an error between the wafer normal and the twist axis 21. However, if the procedure is repeated after removing the test wafer from the holder and remounting it on the holder rotated through 180°, the two sets of measurements can be used to find the alignment error between the wafer normal and the twist axis 21.

When implanting process wafers, this error can be used to modify the twist and tilt correction required to bring the crystal axis of the process wafer precisely into alignment with the ion beam.

It will be appreciated that back scattered ion intensity can be measured only when the beam ions are lighter than the atoms of scattering crystal. Accordingly the above procedure can be used with a Boron beam and a Silicon crystal test wafer. However for Phosphorous, it would be necessary to use a different crystal substance for example Germanium, for the test wafer.

What is claimed is:

1. An alignment measuring apparatus comprising:

a process chamber having a chamber wall;

an ion beam generator to produce a bean of ions for implantation, said beam having a nominal beam direction in said chamber;

a wafer holder in said chamber to carry for ion implantation therein a planar crystalline wafer having a crystal axis nominally normal to the plane of the wafer, said wafer holder having a normal direction which is nominally normal to the plane of a wafer on said holder;

a tilt mechanism for adjusting the tilt angle of said normal direction of the holder relative to said nominal beam direction about an axis perpendicular to said normal direction and to said nominal beam direction; and a twist mechanism for rotating the holder and any wafer thereon to selected rotational positions about an axis nominally parallel to said normal direction, the alignment measuring apparatus comprising:

a scattered ion receiver adapted to be mounted on said chamber wall to receive beam ions back scattered from a wafer on the holder; and a scattered ion current detector for determining the current said back scattered beam ions received by said receiver, said scattered ion receiver including a filter to reject low energy secondary ions from the wafer and pass substantially only back scattered beam ions to said current detector.

2. Measuring apparatus as claimed in claim 1, wherein said scattered ion current detector comprises an ion counter providing a value of said current corresponding to the count after a predetermined counting period.

3. An ion implanter comprising:

a process chamber having a chamber wall;

an ion beam generator to produce a beam of ions for implantation, said beam having a nominal beam direction in said chamber;

a single wafer holder in said chamber to carry for ion implantation therein a single planar crystalline wafer having a crystal axis nominally normal to the plan of the wafer, said wafer holder having a normal direction which is nominally normal to the plane of a wafer on said holder;

a tilt mechanism for adjusting the tilt angle of said normal direction of the holder relative to said nominal beam direction about an axis perpendicular to said normal direction and to said nominal beam direction;

a twist mechanism for rotating the holder, while holding a wafer thereon in the ion beam, to selected rotational positions about an axis nominally parallel to said normal direction;

a scattered ion receiver mounted on said chamber wall to receive beam ions back scattered from a wafer on the holder; and a scattered ion current detector for determining the current of said back scattered beam ions received by said receiver.

4. An ion implanter as claimed in claim 3, wherein said scattered ion receiver includes a filter to reject low energy secondary ions from the wafer and pass substantially only back scattered beam ions to said current detector.

5. An ion implanter as claimed in claim 4, wherein said filter is a magnetic sector momentum analyser.

6. An ion implanter as claimed in claim 4, wherein said filter is a dispersive device providing sufficient dispersion to deflect said low energy secondary ions from reaching said current detector and to pass back scattered beam ions having a range of energies to said detector.

7. An ion implanter as claimed in claim 6, wherein said filter dispersion is selected to pass to the current detector back scattered beam ions above an energy corresponding to the most energetic secondary ions from the wafer.

8. An ion implanter as claimed in claim 3, wherein said scattered ion current detector comprises an ion counter providing a value of said current corresponding to the count after a predetermined counting period.

9. An ion implanter as claimed in claim 3, wherein said beam generator includes a beam deflector controllable to apply selected angular deflections to said beam in said chamber relative to said nominal beam direction, said deflections being in a plane parallel to said twist axis.

10. An ion implanter as claimed in claim 9, wherein said beam deflector comprises at least one of a) a beam scanner for angularly scanning the ion beam to cause said beam in said chamber to be scanned in said plane parallel to said twist axis, and b) a beam collimator for collimating the scanned beam so that said beam in said chamber is parallel scanned.

11. A method of calibrating the direction of an ion beam relative to a single wafer holder in an implant chamber of an ion implanter, comprising:

mounting on the holder a single crystalline material so that the crystal lattice of the crystalline material has a known nominal orientation relative to the holder;

directing the ion beam at the single crystalline material on the holder;

effecting relative movement between the direction of the ion beam and the orientation of the holder while the crystalline material on the holder is continuously in the ion beam;

monitoring the intensity of beam ions back scattered from the crystalline material during said relative movement to identify, from a corresponding minimum in said monitored intensity, at least one selected orientation of the crystal lattice of the crystalline material relative to the ion beam; and using the relative orientation of the ion beam and the holder when said selected crystal lattice orientation is identified and the known nominal orientation of the crystal lattice to the holder to provide a calibration point for the direction of the ion beam relative to the wafer holder.

12. A method as claimed in claim 11, wherein said ion beam has a nominal direction and the wafer holder can tilt the wafer about a tilt axis perpendicular to the nominal beam direction and can rotate the wafer about a twist axis nominally perpendicular to said tilt axis, and the component of the direction of the ion beam relative to the wafer holder in the plane perpendicular to the tilt axis is calibrated by identifying a minimum in the monitored back scattered ion intensity when changing the tilt of the holder.

13. A method as claimed in claim 12, wherein said ion beam direction can be adjusted in a plane parallel to the tilt axis, and the component of the direction of the ion beam relative to the wafer holder in said parallel plane is calibrated by identifying a minimum in the monitored back scattered ion intensity when adjusting the beam direction in said plane.

14. A method as claimed in claim 12, wherein the alignment of an ion beam in the plane of the tilt axis is checked using a crystalline material on the holder with a known crystal direction aligned with said twist axis, by tilting the holder to bring said crystal direction parallel to the plane of the beam parallel to the tilt axis and monitoring the back scattered ion intensity while rotating the holder about the twist axis.

15. A method as claimed in claim 11, wherein after said monitoring step, the orientation of the crystalline material on the holder is reversed by 180°, the monitoring step is repeated and the average of the two calibration points is taken.

16. A method as claimed in claim 1, wherein said single crystalline material is a test wafer having a pre-measured crystal lattice orientation.

17. A method of calibrating the wafer holder in the process chamber of an ion implanter of the type having a process chamber, an ion beam generator to produce a beam of ions for implantation, said beam having a predetermined direction in said chamber, a single wafer holder in said chamber having a normal direction which is normal to the plane of a single wafer on the holder, a tilt mechanism for adjusting the tilt angle of said normal direction relative to said beam direction about a tilt axis perpendicular to said beam direction and to said normal direction, and a twist mechanism for rotating the holder, while holding a wafer thereon in the ion beam, about a twist axis which is perpendicular to said tilt axis and nominally parallel to said normal direction;

the method comprising the steps of:

a) mounting on the holder a crystalline material so as to have a predetermined crystal axis which is normally aligned with said normal direction;

b) tilting the holder to a predetermined tilt angle;

c) rotating the holder about the twist axis between at least selected ranges of twist angles, with the wafer thereon continuously in the ion beam;

d) monitoring the intensity of beam ions back scattered from the crystalline material as the holder is rotated to identify the twist angles corresponding to minima in said monitored intensity; and e) using the values of said identified twist angles with said predetermined tilt angle to calculate the values of tilt angle and twist angle required to compensate for any deviation between the twist axis and said normal direction and to direct said normal direction parallel to said beam direction.

18. A method as claimed in claim 17, wherein the crystalline material has a misalignment between said crystal axis and said normal direction, and said twist angles corresponding to minima are identified with the crystalline material mounted on the holder both in a first-orientation, about said crystal axis, of said material relative to said holder, and also in a second said orientation angularly displaced from said first orientation by an amount corresponding to the rotational symmetry of the structure of the crystalline material about said crystal axis, and using the values of said identified twist angles for both of said first and second orientations to calculate said required tilt and twist angle values.

19. A method as claimed in claim 18, wherein said second orientation is displaced by 180° from said first orientation.

* * * * *